United States Patent
Savoj

(10) Patent No.: US 7,233,182 B1
(45) Date of Patent: Jun. 19, 2007

(54) CIRCUITRY FOR ELIMINATING FALSE LOCK IN DELAY-LOCKED LOOPS

(75) Inventor: Jafar Savoj, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 50 days.

(21) Appl. No.: 11/169,957

(22) Filed: Jun. 28, 2005

Related U.S. Application Data

(60) Provisional application No. 60/635,346, filed on Dec. 10, 2004.

(51) Int. Cl.
*H03L 7/00* (2006.01)

(52) U.S. Cl. .................................. 327/141; 327/147
(58) Field of Classification Search ............... 327/141, 327/142, 147, 149, 150–153, 156, 158, 161–163; 331/17, 25, DIG. 2; 375/373–376
See application file for complete search history.

(56) References Cited

U.S. PATENT DOCUMENTS

| 6,119,242 A | * | 9/2000 | Harrison | 713/503 |
| 6,452,431 B1 | * | 9/2002 | Waldrop | 327/158 |
| 2006/0132205 A1 | * | 6/2006 | Wu et al. | 327/158 |

* cited by examiner

*Primary Examiner*—Linh My Nguyen

(57) ABSTRACT

A delay-locked loop (DLL) acquires correct lock when the delay line on the DLL delays a reference signal by one clock period. False lock occurs when the delay line delays the reference signal by more than one clock period. False lock may be detected by a false lock detector. The false lock detector may include (1) flip-flops to take samples of the delay line outputs and (2) combinational logic for detecting patterns in the samples that may indicate false lock. Once false lock has been detected, a hold circuit may ensure that false lock persists for at least the amount of time required by the DLL to acquire lock (i.e., to prevent reset of the DLL before it has acquired lock). After this determination is made, a reset generator may produce a reset signal for resetting the DLL.

45 Claims, 5 Drawing Sheets

Correct Lock

False Lock

310

CIRCUITRY FOR ELIMINATING FALSE LOCK IN DELAY-LOCKED LOOPS

CROSS REFERENCE TO RELATED APPLICATION

This application is a non-provisional patent application claiming the benefit of U.S. provisional patent application No. 60/635,346, filed Dec. 10, 2004, which is hereby incorporated by reference herein in its entirety.

BACKGROUND OF THE INVENTION

This invention relates to delay-locked loops (DLLs) and, more particularly, to circuitry for eliminating false lock in DLLs.

A DLL may be used to provide delayed copies of a reference signal (e.g., a clock signal), which may be routed to digital circuit elements (e.g., flip-flops, registers, etc.). The DLL may include delay elements, which may be connected in series to create a delay line. When the total delay on the delay line is equal to one period of the reference signal, the DLL is considered to have acquired lock. The DLL detects for this by determining when the reference signal and the delay line output are edge-aligned. Once the DLL has acquired lock, the outputs of the individual delay elements may be used to provide the reference signal, with various amounts of delay, to digital circuit elements.

DLLs serve many useful purposes in digital systems. In one example, DLLs may be used in clock distribution networks to compensate for delays between a clock distribution source and a load. For example, if the clock distribution source is located at a distance from the load, the clock signal will not be received by the load instantaneously, i.e., there will be a delay in the time it takes to receive the clock signal. A DLL may be used to compensate for this delay by adding an additional delay to the transmitted clock signal such that the received clock signal is delayed, in total, by exactly one clock period from the transmitted clock signal. For example, if a clock signal is received 1 nanosecond after it is transmitted and the clock signal has a period of 4 nanoseconds, then a DLL may provide a delay of an additional 3 nanoseconds. In this approach, the transmitted clock signal and the received clock signal have no discernable difference.

In another example, DLLs may be used in subsampling systems. A DLL may produce signals of various phases to the subsampling system.

However, DLLs may also suffer from problems. One possible problem is that a DLL may acquire false lock and provide more delay than intended. Many DLLs assume that correct lock has been acquired when a reference signal is edge-aligned with the output of the delay line. In false lock, the output of the delay line is still edge-aligned with the reference signal. However, the delay line has more than one period of delay. For example, if a DLL has acquired correct lock, delay elements in a three-element delay line each provide a third of a period of delay. In another example, if the DLL has acquired false lock and the delay line has two periods of delay, each delay element provides two-thirds of a period of delay, instead of a third of a period of delay under correct lock. The additional delay in false lock may be undesirable. When false lock is not detected and is allowed to persist, outputs of digital circuit elements using DLL output signals may become skewed and further delayed themselves.

SUMMARY OF THE INVENTION

It is therefore an object of the present invention to eliminate false lock in DLLs.

This and other objects of the present invention are accomplished in accordance with the principles of this invention by providing circuitry for eliminating false lock in DLLs.

A delay-locked loop (DLL) acquires correct lock when the delay line in the DLL delays a reference signal by one clock period and when the delayed signal and the reference signal are edge-aligned. False lock occurs when the delay line delays the reference signal by more than one clock period (e.g., two or three periods) and when the delayed signal and the reference signal are edge-aligned.

False lock may be detected by a false lock detector. The false lock detector may include flip-flops to take samples of the delay line outputs. The false lock detector may also include combinational logic for detecting patterns in the samples that may indicate false lock.

One pattern in the samples that may indicate false lock is all ones or all zeros. When this pattern is detected, it means that the reference signal has not propagated through the delay line.

Another pattern in the samples that may indicate false lock is a zero followed by a one for a rising-edge aligned DLL or a one followed by a zero for a falling-edge aligned DLL. When such transitions are detected, it is an indication that the samples are spread out over more than one clock period. These transitions are meant to occur only at the start and end of a period of the reference signal.

Once false lock has been detected, a hold circuit may ensure that false lock persists for at least the amount of time required by the DLL to acquire lock. This prevents the DLL from being reset prior to acquiring lock. The hold circuit may include a weak PMOS transistor, a capacitor, and a Schmitt trigger. When the PMOS transistor is turned on by the false lock detector, it builds up charge on the capacitor. The Schmitt trigger changes the output of the hold circuit when the charge on the capacitor exceeds the trigger voltage of the Schmitt trigger. The amount of time before the output of the hold circuit changes may depend on the weakness of the PMOS transistor and the capacitance of the capacitor. The hold circuit may also include a strong NMOS transistor for discharging the capacitor to ground when false lock is not detected.

In response to the output of the hold circuit changing, a reset generator may produce a reset signal for resetting the DLL. The reset generator may include a PMOS transistor, a capacitor, a Schmitt trigger, and a NAND gate. When the PMOS transistor is turned on by the output of the hold circuit, it builds up charge on the capacitor. The Schmitt trigger fires when the voltage on the capacitor exceeds a triggering voltage for the Schmitt trigger. The NAND gate receives the output of the hold circuit and the output of the Schmitt trigger to produce the reset signal for resetting the DLL. The reset signal may be a pulse, and the width of the pulse may depend on the weakness of the PMOS transistor and the capacitance of the capacitor.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
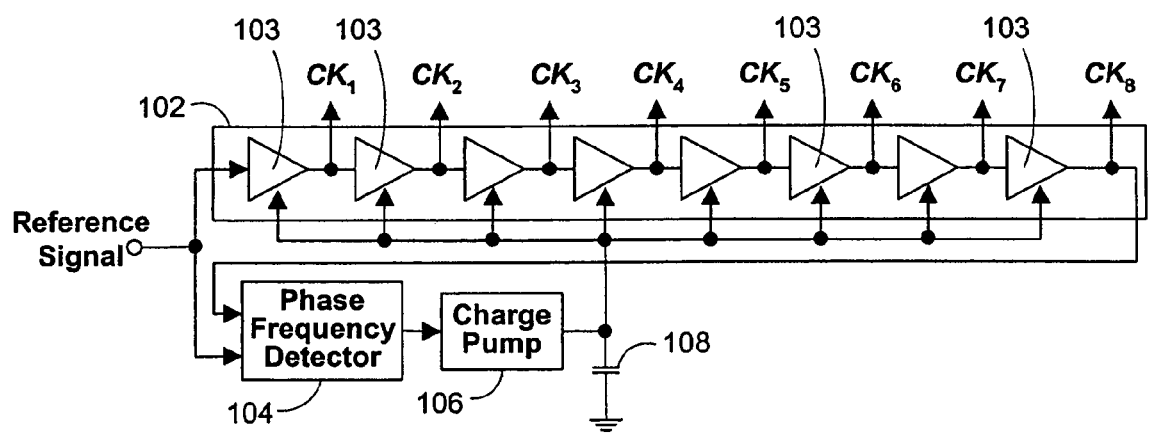
FIG. 1 is a block diagram of a prior art DLL.

FIG. 1 is an illustrative block diagram of a prior art DLL 100. DLL 100 may include a delay line 102, a phase frequency detector 104, a charge pump 106, and a capacitor 108.

Delay line 102 may include a plurality of delay elements 103 connected in series. The number of delay elements may determine the incremental delay that may be provided by DLL 100. For example, in correct lock the total delay on delay line 102 is one period, thus a three-element delay line may provide delay to a signal in increments of thirds of a period, whereas a ten-element delay line may provide delay to a signal in increments of tenths of a period. Each delay element 103 may be controlled by a common control voltage (output by charge pump 106), such that all the delay elements contribute the same amount of delay.

The control voltage may be monotonically increasing with the delay or monotonically decreasing with the delay. For example, if the control voltage is monotonically increasing with the delay, a higher control voltage causes each delay element 103 to produce a larger delay. If the control voltage is monotonically decreasing with the delay, a higher control voltage causes each delay element 103 to create a smaller delay.

A reference signal (e.g., a clock signal) may be input into delay line 102. As the reference signal propagates through delay line 102, delayed copies of the reference signal are produced by the delay elements (e.g., CK1, CK2, CK3, CK4, CK5, CK6, CK7, and CK8). Because the delay elements are coupled in series, each delay element adds to the delay contributed by the preceding delay elements. For example, in an eight-element delay line, the output of the fifth element is a copy of the reference signal delayed by 5/8 of a period (i.e., the delay produced by it and the four preceding delay elements at 1/8 of a period each).

In some embodiments, when DLL 100 starts, the control voltage may be set to produce very little delay on delay line 102. For example, if delay monotonically increases as a function of the control voltage, the control voltage may be initialized at ground. In another example, if delay monotonically decreases as a function of the control voltage, the control voltage may be initialized at the source voltage. If the control voltage was initialized arbitrarily, it would be difficult to determine whether the delay on delay line 102 should be increased or decreased for DLL 100 to acquire correct lock.

As shown in FIG. 1, DLL 100 includes a feedback loop, in which the output of delay line 102 is fed back into phase frequency detector 104. Phase frequency detector 104 may compare the reference signal and the output of delay line 102 to determine if the two signals are edge-aligned. If the two signals are edge-aligned, then phase frequency detector 104 allows charge pump 106 to maintain its current output voltage.

On the other hand, if phase frequency detector 104 determines that the output of delay line 102 is not edge-aligned with the reference signal, phase frequency detector 104 may induce charge pump 106 to change its output voltage to increase the delay of delay line 102. Charge pump 106 may continue to increase the delay on delay line 102 until phase frequency detector 104 determines that the two signals it receives are edge-aligned. Capacitor 108 may be provided at the output of charge pump 106 to provide an AC ground for noise. Noise may create fluctuations in the control voltage and this may interfere with acquiring lock.

False lock may occur if phase frequency detector 104 fails to detect edge-alignment when delay line 102 has one period of delay. Charge pump 106 may continue to increase the delay on delay line 102. Phase frequency detector 104 may finally detect edge alignment when the delay on delay line 102 is two periods or more.

Figure 2A:
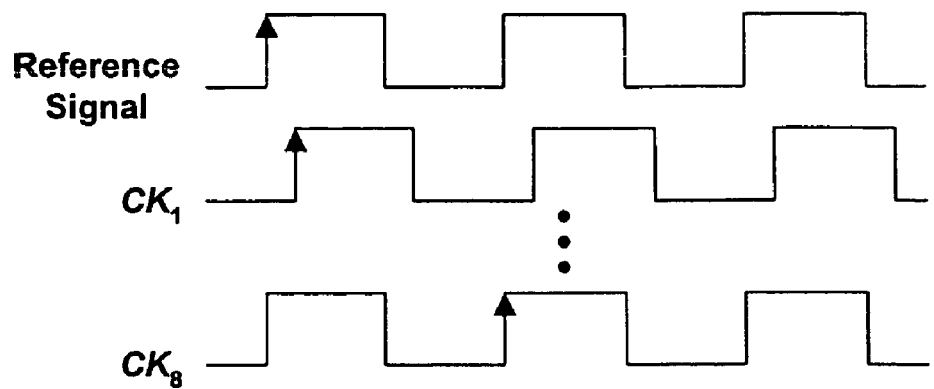
FIGS. 2A and 2B are signal diagrams that show a prior art DLL in correct and false lock.

FIG. 2A is a signal diagram that shows prior art DLL 100 in correct lock. Correct lock is achieved when delay line 102 (FIG. 1) has a total delay of one period of the reference signal. As shown in FIG. 2A, CK8 (i.e., the output of the last element on delay line 102 (FIG. 1)) is delayed by exactly one period from the reference signal.

Figure 2B:
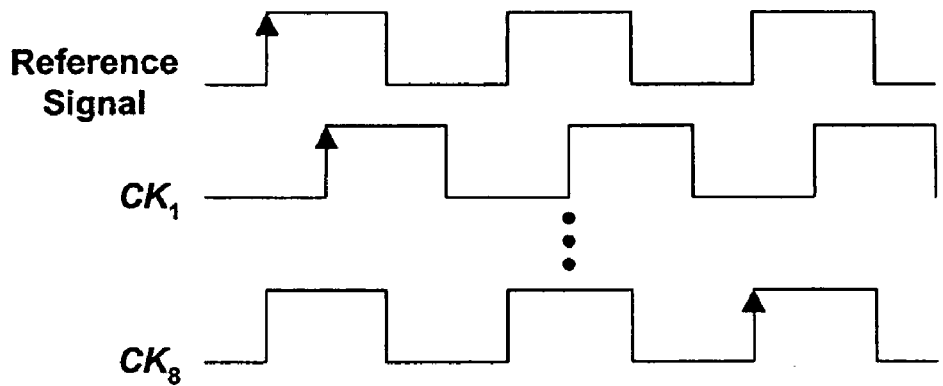

FIG. 2B is a signal diagram that shows prior art DLL 100 in false lock. As shown in FIG. 2B, the rising edge of CK8 is aligned with a rising edge of the reference signal. However, CK8 is delayed from the reference signal by two periods.

There is almost no difference between the CK8 signals shown in FIGS. 2A and 2B. However, there are clear differences between the other output signals of DLL 100 in correct and false lock. In correct lock, as shown in FIG. 2A, the delays on the output signals of DLL 100 are all within one period of the reference signal. In false lock, as shown in FIG. 2B, the delays on the output signals of DLL 100 are spread out over two or more periods. This means that, in false lock, the delay provided by each delay element is larger than in correct lock. For example, as shown in FIG. 2A, CK1 is provided with a small amount of delay. In FIG. 2B, CK1 has two times the amount of delay as CK1 in FIG. 2A because the delay in FIG. 2B is spread over two periods.

The additional delay caused by false lock may be undesirable. When false lock is not detected and is allowed to persist, the outputs of digital circuit elements using the DLL output signals may become skewed and further delayed themselves.

Figure 3:
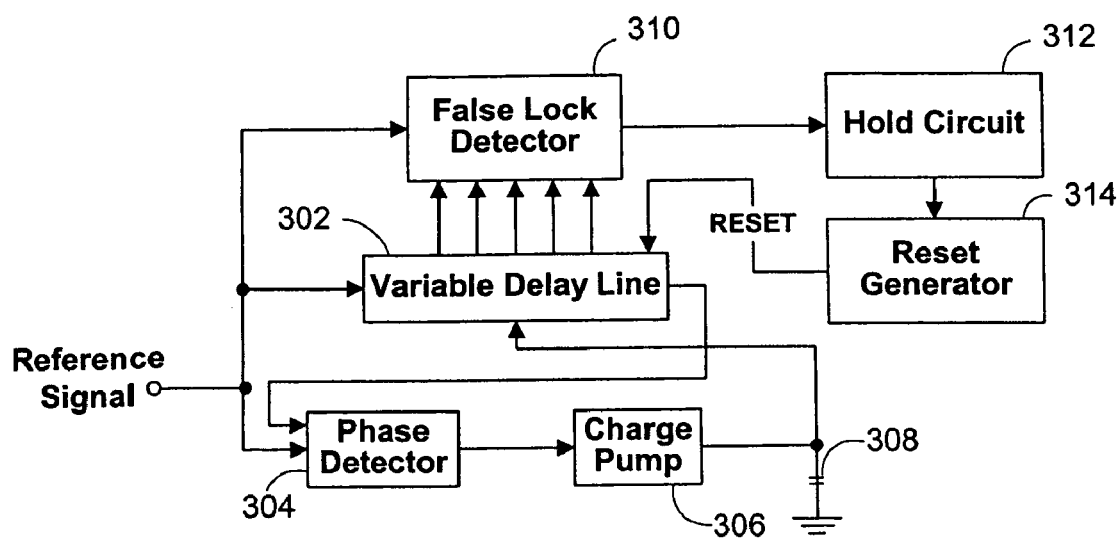
FIG. 3 is a block diagram of an illustrative DLL with false lock detection and correction in accordance with the present invention.

FIG. 3 is a block diagram of an illustrative DLL 300 with false lock detection and correction in accordance with the present invention. DLL 300 includes a delay line 302, phase frequency detector 304, charge pump 306, capacitor 308, false lock detector 310, hold circuit 312, and reset generator 314.

As with DLL 100 (FIG. 1), phase frequency detector 304 may determine whether the edges of a reference signal and the output of delay line 302 are aligned. If not, phase frequency detector 304 induces charge pump 306 to increase the delay provided by delay line 302 until the output of delay line 302 is edge-aligned with the reference signal.

It should be understood by one skilled in the art that a phase detector may be used in DLL 300 instead of phase frequency detector 304. The decision to use either a phase detector or a phase frequency detector is a design choice that must take into account the tradeoffs of using one type of detector over the other. Although phase frequency detectors acquire lock faster than phase detectors, phase frequency detectors have a higher likelihood of acquiring false lock than phase detectors because the phase frequency detectors operate according to a state machine.

DLL 300 is shown in FIG. 3 as including a false lock detector 310, a hold circuit 312, and a reset generator 314. False lock detector 310 may be responsive to the outputs of delay line 302 to determine when false lock conditions are met. Hold circuit 312 may be responsive to false lock detector 310 to determine if false lock conditions have persisted for at least the amount of time required to acquire lock. Hold circuit 312 may also be responsive to reset generator 314. Reset generator 314 may be responsive to delay line 302 to provide a reset signal to delay line 302. False lock detector 310, hold circuit 312, and reset generator 314 will be discussed in greater detail hereinbelow.

Figure 4:
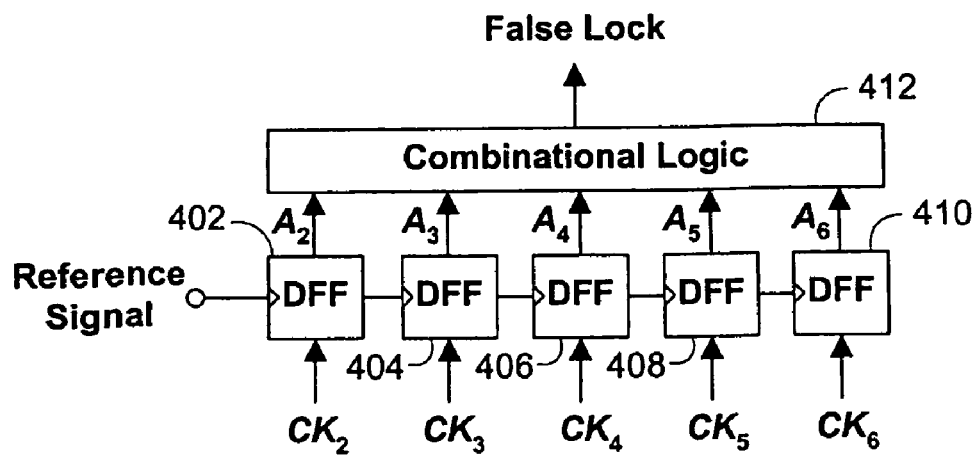
FIG. 4 is a block diagram of an illustrative false lock detector in accordance with the present invention.

FIG. 4 is a block diagram of an illustrative false lock detector 310 in accordance with the present invention. False lock detector 310 may detect patterns in the samples of the delay element outputs, which may indicate when DLL 300 (FIG. 3) is in false lock. One pattern that may indicate false lock is when samples of the delay element outputs are all ones or all zeros. When samples of the delay element outputs are all ones or all zeros, the reference signal has not propagated through delay line 302 (FIG. 3).

Other patterns in the samples of the delay element outputs may also indicate that DLL 300 (FIG. 3) has acquired false lock. For example, if correct lock has been acquired and the reference signal and the output of delay line 302 (FIG. 3) are rising-edge aligned, the first few samples of the delay element outputs are zeros and the last few samples are ones. When the samples of the delay element outputs stretch beyond one period, the samples change value more often—from ones to zeros, and back to ones again. In a rising-edge aligned DLL, a one-to-zero transition between consecutive samples may be an indication of false lock. In some embodiments, the reference signal and the delayed signal may be falling-edge aligned. In this case, a zero-to-one transition in the samples of the delay element outputs may be an indication of false lock. Regardless of the type of edge-alignment used by DLL 300 (FIG. 3), the presence of bit transitions not present in the samples of the delay element outputs in correct lock may be an indication of false lock.

False lock detector 310 may include D-type flip-flops 402, 404, 406, 408, and 410 and combinational logic 412 for detecting patterns of false lock. Flip-flops 402, 404, 406, 408, and 410 may store samples of the outputs of the delay line elements. The flip-flops may be clocked on a rising or falling edge of the reference signal, depending on whether DLL 300 (FIG. 3) is rising-edge aligned or falling-edge aligned.

It should be understood by those skilled in the art that any number of samples may be taken by false lock detector 310. In some embodiments, more samples may be taken to detect circumstances where the delay signal is delayed by a large number of periods. In some embodiments, fewer samples may be taken to simplify combinational logic 412. In some embodiments, the number of samples may be determined by balancing the risk of failing to detect false lock against the complexity of combinational logic 412.

Once samples of the delay element outputs have been obtained, combinational logic 412 may process the samples stored in the flip-flops to determine whether any patterns indicating false lock are present.

Figure 5:
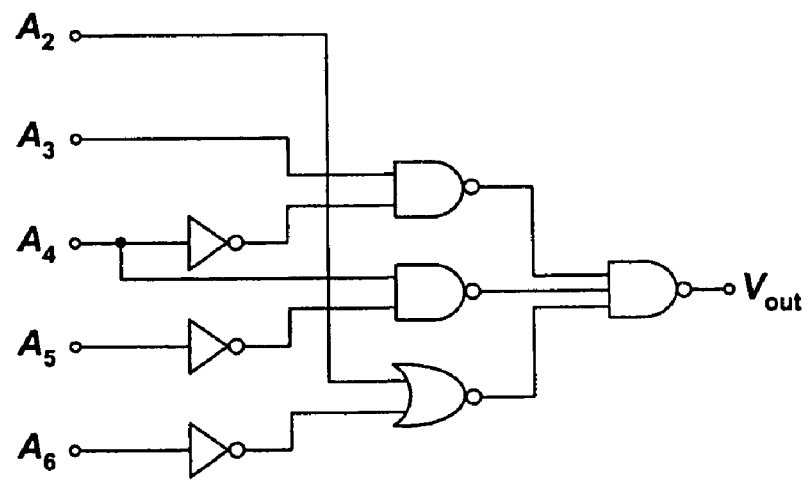
FIG. 5 is a circuit diagram of illustrative combinational logic for detecting false lock in accordance with the present invention.

FIG. 5 is a circuit diagram of illustrative combinational logic 412 for detecting false lock in accordance with the present invention. In particular, combinational logic 412 may detect for patterns in the samples of delay element outputs that indicate false lock. A sum of products expression may be derived, in which each product indicates false lock when equal to one.

Combinational logic 412 may include products that indicate when the clock signal has not yet propagated through delay line 302 (FIG. 3). For example, one product, $A_2 A_3 A_4 A_5$, returns a one when all of the samples are ones. In another example, another product, $\overline{A_2 A_3 A_4 A_5}$, returns a one when all of the samples are zeros. When one of these products returns a one, false lock detector 310 (FIG. 4) returns a one.

Combinational logic 412 may also include products for determining whether the reference signal has been delayed by more than one period. Assuming DLL 300 (FIG. 3) is aligned to the rising edge of the reference signal, one of these products returns a one if a one-to-zero transition occurs between consecutive samples. One-to-zero transitions may be detected by taking products of samples and the complements of adjacent samples (e.g., $A_2 \overline{A_3}$). If any of the products are equal to one, then a one-to-zero transition is present and the samples are spread out over more than one clock period. Based on the configuration of false lock detector 310 (FIG. 4), products for detecting one-to-zero transitions may be written in expression form as $A_2 \overline{A_3}$, $A_3 \overline{A_4}$, $A_4 \overline{A_5}$, and $A_5 \overline{A_6}$.

In some embodiments, if DLL 300 (FIG. 3) is aligned with the falling edge of the reference signal, a transition from a zero to a one between consecutive samples may indicate that the signal has been delayed by more than one period. In this case, the products for detecting a delay of more than one period may be the product of the complement of one sample and the adjacent sample. Products for detecting zero-to-one transitions may be written in expression form as $\overline{A_2} A_3$, $\overline{A_3} A_4$, $\overline{A_4} A_5$, and $\overline{A_5} A_6$.

When all of the products in the sum of products have been determined, the sum of products expression may be simplified and the simplified expression may be implemented using gates. As shown in FIG. 5, combinational logic 412 has been simplified from the products described above.

Figure 6:
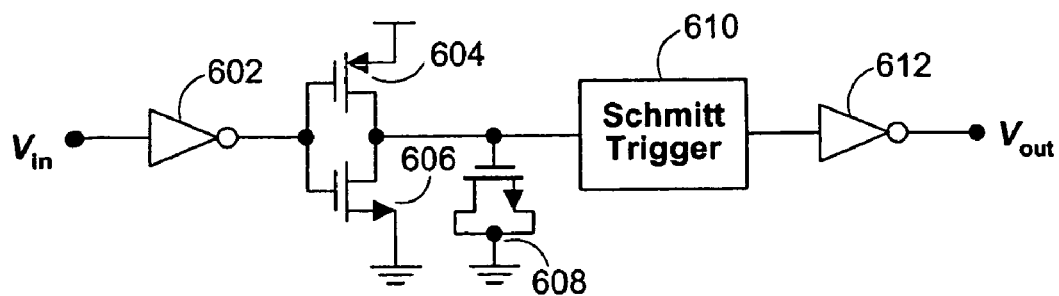
FIG. 6 is a circuit diagram of an illustrative hold circuit in accordance with the present invention.

FIG. 6 is a circuit diagram of an illustrative hold circuit 312 in accordance with the present invention. Hold circuit 312 may be coupled to the output of false lock detector 310 (FIG. 4). Even if false lock detector 310 (FIG. 4) indicates that DLL 300 is in false lock, hold circuit 312 ensures that DLL 300 has had an opportunity to acquire lock before DLL 300 is reset. For example, false lock detector 310 may indicate that there is a false lock before DLL 300 has acquired lock. In this instance, it would be undesirable to reset DLL 300. Therefore, hold circuit 312 may be provided to ensure that the minimum amount of time for DLL 300 to acquire lock has elapsed before allowing reset generator 314 to reset DLL 300.

Hold circuit 312 may include an input inverter 602, a weak PMOS 604, a strong NMOS 606, a capacitor 608, a Schmitt trigger 610, and an output inverter 612. When DLL 300 (FIG. 3) has acquired correct lock, the output of false lock detector 310 (FIG. 4) is zero. When the output of false lock detector 310 (FIG. 4) is zero, strong NMOS 606 is turned on and the voltage on capacitor 608 is discharged rapidly towards ground.

On the other hand, when DLL 300 (FIG. 3) is in false lock, false lock detector 310 (FIG. 4) outputs a one. When a one is input into hold circuit 312, weak PMOS 604 turns on and strong NMOS 606 turns off. When weak PMOS 604 is on, the voltage on capacitor 608 builds up until the voltage exceeds a triggering voltage for Schmitt trigger 610. When Schmitt trigger 610 is triggered, Schmitt trigger 610 fires and the output of hold circuit 312 changes state to a one. If false lock detector 310 (FIG. 4) outputs a zero at any time prior to hold circuit 312 changing state, strong NMOS 606 rapidly discharges capacitor 608 to ground, which prevents hold circuit 312 from changing state.

The amount of time required to maintain a one on the input of hold circuit 312 before hold circuit 312 changes state may depend on two factors: the weakness of PMOS 604 and the capacitance of capacitor 608. In some embodiments, these two factors may be balanced such that the amount of time needed for hold circuit 312 to change state is equal to the acquisition time of DLL 300 (FIG. 3). In this approach, DLL 300 will have had an opportunity to acquire lock before hold circuit 312 is allowed to change state.

It should be understood by one skilled in the art that hold circuit 312 is only illustrative and any circuit may be used in DLL 300 (FIG. 3) that ensures that false lock has persisted for at least the amount of time required for DLL 300 to acquire lock before resetting DLL 300.

Figure 7:
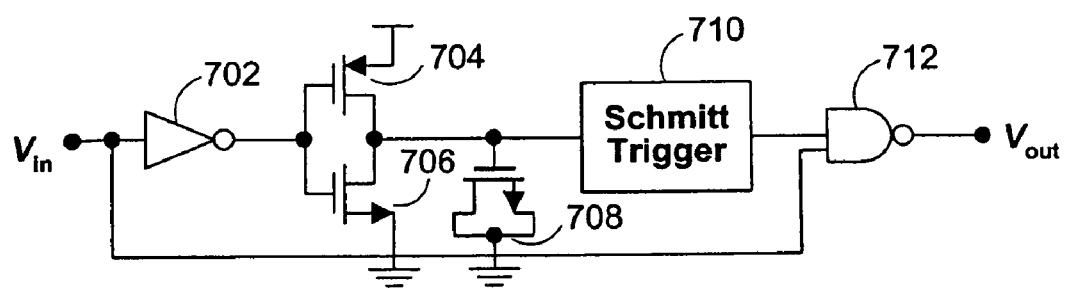
FIG. 7 is a circuit diagram of an illustrative reset generator for resetting a DLL in accordance with the present invention.

FIG. 7 is a circuit diagram of an illustrative reset generator 314 for resetting a DLL 300 (FIG. 3) in accordance with the present invention. When the output of hold circuit 312 (FIG. 6) makes a zero-to-one transition, reset generator 314 generates a signal to reset DLL 300. The reset signal is held for an amount of time necessary to reset DLL 300. In some embodiments, the reset signal is held for the minimum amount of time necessary to reset DLL 300.

Reset generator 314 may include an input inverter 702, a weak PMOS 704, a strong NMOS 706, a capacitor 708, a Schmitt trigger 710, and an output NAND gate 712. As shown in FIG. 3, the input of reset generator 314 is coupled to the output of hold circuit 312 and the output of reset generator 314 is coupled to delay line 302.

In response to false lock detector 310 (FIG. 4) detecting a false lock for at least a certain amount of time, the input of reset generator 314 changes from a zero to a one. As a result, weak PMOS 704 turns on and capacitor 708 begins to charge. When the voltage across capacitor 708 reaches the triggering voltage of Schmitt trigger 710, the output of Schmitt trigger 710 changes from a one to a zero. Because the voltage on capacitor 708 takes time to charge, the output of Schmitt trigger 710 does not change until a certain amount of time after the input of reset generator 314 changes. As a result, when the output of Schmitt trigger 710 and the input of reset generator 314 are multiplied together, a pulse is created which may be input into delay line 302 (FIG. 3) to reset DLL 300 (FIG. 3). The width of the pulse is equal to the delay in changing the output of Schmitt trigger 710.

The width of the pulse may be adjusted based on two factors: the weakness of weak PMOS 704 and the capacitance of capacitor 708. In some embodiments, these two factors may be set such that the width of the pulse is equal to the minimum amount of time required to reset DLL 300 (FIG. 3).

In some embodiments, the reset signal may be applied directly to the delay elements on delay line 302 (FIG. 3). For example, the reset signal may be applied to the control voltage node on delay line 302 such that delay line 302 produces very little delay.

It should be understood by one skilled in the art that reset circuit 314 is only illustrative and any circuit may be used to reset DLL 300 (FIG. 3) if it is determined that DLL 300 has acquired false lock.

An additional benefit provided by using false lock detection circuitry 310 (FIG. 4) in DLL 300 (FIG. 3) is that DLL 300 does not require an external finite state machine to start. DLL 300 may start in any state and if it is undesirable to remain in that state (e.g., false lock), DLL 300 will reset itself. For example, if DLL 300 arbitrarily starts with no delay on delay line 302 (FIG. 3), then DLL 300 will acquire correct lock without utilizing the false lock detection circuitry 310. In another example, if DLL 300 arbitrarily starts with a large delay on delay line 302, DLL 300 will detect false lock (if present) and automatically reset itself and reacquire correct lock.

It will be understood that the foregoing is only illustrative of the principles of the invention and that various modifications can be made by those skilled in the art without departing from the scope and spirit of the invention.

What is claimed is:

1. A circuit for eliminating false lock in a delay-locked loop (DLL) comprising:
    a false lock detector to detect patterns in samples of outputs of the DLL that indicate false lock, wherein the false lock detector outputs a first signal when a false lock pattern is detected;
    a hold circuit that receives the first signal and outputs a second signal if the first signal has been output for at least a predetermined amount of time; and
    a reset generator that receives the second signal and produces a reset signal to reset the DLL.

2. The circuit defined in claim 1, wherein the false lock detector further comprises:
    a memory to store the samples of the outputs of the DLL; and
    combinational logic to detect false lock patterns in the samples stored in the memory.

3. The circuit defined in claim 2, wherein the memory is a flip-flop.

4. The circuit defined in claim 1, wherein the predetermined amount of time required for the hold circuit to output the second signal is at least equal to the minimum amount of time required for the DLL to acquire lock.

5. The circuit defined in claim 1, wherein one of the false lock patterns is all ones or all zeros.

6. The circuit defined in claim 1, wherein one of the false lock patterns is a one followed by a zero if the DLL is rising-edge aligned or a zero followed by a one if the DLL is falling-edge aligned.

7. The circuit defined in claim 1, wherein the reset signal is a pulse, and wherein the pulse lasts for a duration of time necessary to reset the DLL.

8. The circuit defined in claim 1, wherein the hold circuit comprises:
    a weak MOS transistor of a first polarity;
    a capacitor responsive to the source of the MOS transistor, wherein a voltage builds up on the capacitor when the MOS transistor is turned on by the first signal; and
    a Schmitt trigger that changes the output of the hold circuit when the voltage on the capacitor exceeds a triggering voltage for the Schmitt trigger.

9. The hold circuit defined in claim 8, further comprising:
a strong MOS transistor of a second polarity to discharge the voltage on the capacitor to ground when the first signal is no longer applied to the hold circuit.

10. The circuit defined in claim 1, wherein the reset generator comprises:
a weak MOS transistor of a first polarity;
a capacitor responsive to the source of the MOS transistor, wherein a voltage builds up on the capacitor when the MOS transistor is turned on by the second signal;
a Schmitt trigger that fires when the voltage on the capacitor exceeds a triggering voltage for the Schmitt trigger; and
a NAND gate that receives the second signal and the output of the Schmitt trigger to produce the reset signal to reset the DLL.

11. A delay-locked loop (DLL) circuit comprising:
a variable delay line comprising a plurality of delay elements connected in series, wherein a reference signal is input into the first delay element, and wherein each delay element outputs a delayed copy of the reference signal; and
a false lock detector to detect false lock patterns in samples of the delay element outputs, wherein the false lock detector comprises a memory to store the samples of the delay element outputs and combinational logic to detect false lock patterns in the outputs stored in the memory.

12. The DLL circuit defined in claim 11 further comprising:
a phase detector to determine whether the output of last delay element is edge-aligned with the reference signal; and
a charge pump responsive to the phase detector to adjust the amount of delay provided by the delay elements, wherein the amount of delay is adjusted to cause the output of the last delay element to be edge-aligned with the reference signal.

13. The DLL circuit defined in claim 12 further comprising a hold circuit that produces an output signal when the false lock detector detects a continuous false lock pattern for a predetermined amount of time.

14. The DLL circuit defined in claim 13 further comprising a reset generator that generates a reset pulse to reset the variable delay line in response to the reset generator receiving the output signal from the hold circuit.

15. The DLL circuit defined in claim 13, wherein the predetermined amount of time required for the hold circuit to produce the output signal is at least equal to the minimum amount of time required to acquire lock.

16. A method for eliminating false lock in a delay-locked loop (DLL) having a variable delay line comprising:
detecting false lock patterns in samples of outputs of the variable delay line that indicate false lock;
determining whether the DLL has acquired false lock for at least a predetermined amount of time; and
in response to determining that the DLL has acquired false lock for at least the predetermined amount of time, producing a reset signal to reset the DLL.

17. The method defined in claim 16, wherein detecting false lock patterns comprises:
storing the samples of the outputs of the variable delay line in a memory; and
detecting false lock patterns in the samples stored in the memory using combinational logic.

18. The method defined in claim 17, wherein the memory is a flip-flop.

19. The method defined in claim 16, wherein the predetermined amount of time is at least equal to the minimum amount of time required for the DLL to acquire lock.

20. The method defined in claim 16, wherein one of the false lock patterns is all ones or all zeros.

21. The method defined in claim 16, wherein one of the false lock patterns is a one followed by a zero if the DLL is rising-edge aligned or a zero followed by a one if the DLL is falling-edge aligned.

22. The method defined in claim 16, wherein the reset signal is a pulse, and wherein the pulse lasts for a duration of time necessary to reset the DLL.

23. The method defined in claim 16, wherein determining whether the DLL has acquired false lock for at least a predetermined amount of time comprises:
allowing a voltage to build up on a capacitor when the DLL has acquired false lock; and
changing the state of a Schmitt trigger when the voltage on the capacitor exceeds the triggering voltage of the Schmitt trigger.

24. The method defined in claim 23, further comprising:
rapidly discharging the voltage on the capacitor when the DLL has not acquired false lock.

25. The method defined in claim 16, wherein producing a reset signal to reset the DLL comprises:
allowing a voltage to build up on a capacitor when it is determined that the DLL has acquired false lock for at least a predetermined amount of time;
changing the state of a Schmitt trigger when the voltage on the capacitor exceeds the triggering voltage of the Schmitt trigger; and
producing the reset signal from a period when it is determined that the DLL has acquired false lock for at least the predetermined amount of time until the Schmitt trigger changes state.

26. A method of using a delay-locked loop (DLL) comprising:
inputting a reference signal into a variable delay line having a plurality of delay elements connected in series, wherein the reference signal is input into the first delay element, and wherein each delay element outputs a delayed copy of the reference signal; and
detecting false lock patterns in samples of the delay element outputs, wherein detecting false lock patterns comprises storing the samples of the delay element outputs in a memory and detecting false lock patterns in the outputs stored in the memory using combinational logic.

27. The method defined in claim 26 further comprising:
determining whether the output of the last delay element is edge-aligned with the reference signal; and
adjusting the amount of delay on the plurality of delay elements to cause the output of the last delay element to be edge-aligned with the reference signal.

28. The method defined in claim 27 further comprising determining whether the DLL has acquired a continuous false lock for at least a predetermined amount of time.

29. The method defined in claim 28 further comprising generating a reset pulse to reset the variable delay line in response to determining that the DLL has acquired a false lock for at least the predetermined amount of time.

30. The method defined in claim 28, wherein the predetermined amount of time required is at least equal to the minimum amount of time required for the DLL to acquire lock.

31. A system for eliminating false lock in a delay-locked loop (DLL) having a variable delay line comprising:
    means for detecting false lock patterns in samples of outputs of the variable delay line that indicate false lock;
    means for determining whether the DLL has acquired false lock for at least a predetermined amount of time; and
    in response to determining that the DLL has acquired false lock for at least the predetermined amount of time, means for producing a reset signal to reset the DLL.

32. The system defined in claim 31, wherein detecting false lock patterns comprises:
    means for storing the samples of the outputs of the variable delay line in a memory; and
    means for detecting false lock patterns in the samples stored in the memory using combinational logic.

33. The system defined in claim 32, wherein the memory is a flip-flop.

34. The system defined in claim 31, wherein the predetermined amount of time is at least equal to the minimum amount of time required for the DLL to acquire lock.

35. The system defined in claim 31, wherein one of the false lock patterns is all ones or all zeros.

36. The system defined in claim 31, wherein one of the false lock patterns is a one followed by a zero if the DLL is rising-edge aligned or a zero followed by a one if the DLL is falling-edge aligned.

37. The system defined in claim 31, wherein the reset signal is a pulse, and wherein the pulse lasts for a duration of time necessary to reset the DLL.

38. The system defined in claim 31, wherein the means for determining whether the DLL has acquired false lock for at least a predetermined amount of time comprises:
    means for allowing a voltage to build up on a capacitor when the DLL has acquired false lock; and
    means for changing the state of a Schmitt trigger when the voltage on the capacitor exceeds the triggering voltage of the Schmitt trigger.

39. The system defined in claim 38, further comprising:
    means for rapidly discharging the voltage on the capacitor when the DLL has not acquired false lock.

40. The system defined in claim 31, wherein the means for producing a reset signal to reset the DLL comprises:
    means for allowing a voltage to build up on a capacitor when it is determined that the DLL has acquired false lock for at least a predetermined amount of time;
    means for changing the state of a Schmitt trigger when the voltage on the capacitor exceeds the triggering voltage of the Schmitt trigger; and
    means for producing the reset signal from a period when it is determined that the DLL has acquired false lock for at least the predetermined amount of time until the Schmitt trigger changes state.

41. A system of using a delay-locked loop (DLL) comprising:
    means for inputting a reference signal into a variable delay line having a plurality of delay elements connected in series, wherein the reference signal is input into the first delay element, and wherein each delay element outputs a delayed copy of the reference signal; and
    means for detecting false lock patterns in samples of the delay element outputs, wherein the means for detecting false lock patterns comprises means for storing the samples of the delay element outputs in a memory and means for detecting false lock patterns in the outputs stored in the memory using combinational logic.

42. The system defined in claim 41 further comprising:
    means for determining whether the output of the last delay element is edge-aligned with the reference signal; and
    means for adjusting the amount of delay on the plurality of delay elements to cause the output of the last delay element to be edge-aligned with the reference signal.

43. The system defined in claim 42 further comprising means for determining whether the DLL has acquired a continuous false lock for at least a predetermined amount of time.

44. The system defined in claim 43 further comprising means for generating a reset pulse to reset the variable delay line in response to determining that the DLL has acquired a false lock for at least the predetermined amount of time.

45. The system defined in claim 43, wherein the predetermined amount of time required is at least equal to the minimum amount of time required for the DLL to acquire lock.

* * * * *